United States Patent [19]

Wyatt

[11] Patent Number: 5,030,848
[45] Date of Patent: Jul. 9, 1991

[54] PRECISION VOLTAGE DIVIDER

[75] Inventor: Michael A. Wyatt, Clearwater, Fla.

[73] Assignee: Honeywell Inc., Minneapolis, Minn.

[21] Appl. No.: 489,410

[22] Filed: Mar. 6, 1990

[51] Int. Cl.$^5$ .................... H03K 3/01; G06G 7/10
[52] U.S. Cl. .................... 307/296.8; 307/491; 307/496; 323/313
[58] Field of Search ............ 307/296.6, 296.8, 491, 307/496, 264, 15; 323/313

[56] References Cited

U.S. PATENT DOCUMENTS

| | | | |
|---|---|---|---|
| 3,864,579 | 2/1975 | Klasing | 307/15 |
| 3,942,046 | 3/1976 | Limberg | 307/296.8 |
| 4,063,147 | 12/1977 | Hatanaka et al. | 323/222 |
| 4,229,668 | 10/1980 | Ebihara | 307/304 |
| 4,298,811 | 11/1981 | Salter et al. | 307/296.8 |

OTHER PUBLICATIONS

Copy of EDN Mar. 16, 1989 Article "Divider Displays Uncanny Accuracy".

Primary Examiner—Stanley D. Miller
Assistant Examiner—Richard Roseen
Attorney, Agent, or Firm—John G. Shudy, Jr.; Ian D. MacKinnon

[57] ABSTRACT

A voltage divider circuit having divider resistors which are not precision resistors. A first oscillating signal is input into a first resistor and the complement of the first oscillating signal is input into a second resistor. The two resistors are connected together and to a filter. Other means, such as transistors, may be utilized in lieu of the resistors. The output at the filter is the D.C. level of the first oscillating signal which is one-half or other designated ratio of the input voltage. Buffers may be incorporated in the invention.

22 Claims, 2 Drawing Sheets

PRECISION VOLTAGE DIVIDER

FIELD OF THE INVENTION

The present invention pertains to a voltage divider capable of dividing a known reference voltage in half. More particularly, it pertains to a voltage divider which is capable of precisely dividing a known reference voltage in half without the use of precision resistors.

BACKGROUND OF THE INVENTION

In the past, voltage dividers have commonly consisted of two resistors connected between a first reference voltage and a second reference voltage such as a ground. The two resistors were connected in series and the center terminal, where the two resistors were electrically connected, was used as the output. The output was the value of the resistor connected to ground times the value of the reference voltage divided by the summation of the values of the two resistors, as stated in the following formula.

$$Vout = Vref[R2/(R1+R2)]$$

This form of a voltage divider requires that the two resistors be substantially the same value, (for $$Vout = \frac{Vref}{2})$$

the error being measured in their difference. Although this configuration is simple to use, the present invention is a configuration wherein the two resistors need not be of an equal value. This invention provides precise voltage division by 2 with resistors that may vary from each other by as much as fifty percent (50%) or more.

SUMMARY OF THE INVENTION

The precision voltage divider comprises a means for providing an oscillating signal and an electrical network. The means for providing the oscillating signal supplies a first oscillating signal having peak voltages as first and second reference voltage signals. Hereinafter, the first reference voltage shall be referred to as "reference voltage" and the second reference voltage as "ground" or "zero volts". The means for providing the oscillating signals provides a signal which oscillates between the reference voltage and ground. The means for providing the oscillating signal further outputs a second oscillating signal. The second oscillating signal is the complement of the first oscillating signal. The oscillating signals are provided to an electrical network. The electrical network comprises a first resistive means connected between a first and third node, a second resistive means connected between a second node and the third node, and a filter means connected to the third node. The first oscillating signal is provided to the first node. The second oscillating signal is provided to the second node. Finally the filter means is connected to the second reference voltage.

DESCRIPTION OF THE PREFERRED EMBODIMENT

Figure 1:
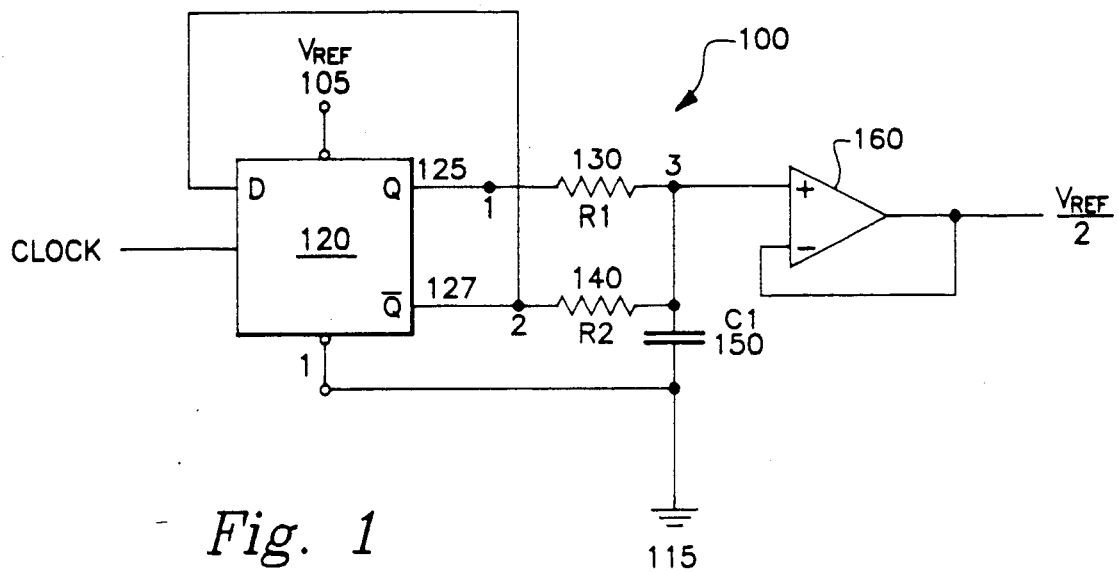
FIG. 1 is a schematic diagram of the invention in its basic form.

Embodiment of FIG. 1 is voltage divider 10 with reference voltage (Vref) 105 that is to be divided, as the supply voltage to D flip-flop 120. By using Vref 105 as the supply voltage, the output of D flip-flop 120 will be Vref 105 when the logic level is a level 1. When the logic level of D flip-flop 120 is 0, the output of the D flip-flop 120 will be ground 115 or zero volts. By clocking D flip-flop 120, Q 125 and Q 127 alternate between Vref 105 and ground 115. The output signal of D flip-flop 120 is a square wave symmetrical about its average D.C. level. The D.C. level is one-half of Vref 105 with respect to ground 115. Further, the outputs of Q 125 and Q 127 are complementary or 180 degrees out of phase.

The means for providing the oscillating signal may be a CMOS flip-flop 120. The CMOS flip-flop 120 uses a clock pulse to trigger the flip-flop 120 continuously from a level 1 signal to a level 0 signal and, consequently, back to a level 1 signal. In this manner, the CMOS flip-flop 120 toggles the first and second resistive means 130 and 140 between the first reference voltage signal 105 and ground 115. The resistive means 130 and 140 need not be precision resistors as the toggling action along with filter means 150 averages any error toward zero. Thus, due to the characteristics of the toggling action and the use of the filter means 150, the effects of the flip-flop's 120 output transistors, on-resistances and any mismatch between the divider resistors 130 and 140 tends to average out; therefore, the major source of inaccuracy in this circuit is the asymmetry in the flip-flop's 120 time division. In the development of large scale integrated circuits (LSIC's), voltage division may be required. Through the use of the present invention, it is possible to accurately divide a reference voltage in half without the use of precision resistors.

The two outputs of D flip-flop 120 are connected to an electrical network with nodes 1, 2, and 3. Resistor R1 130 is connected between nodes 1 and 3 and resistor R2 140 is electrically connected between nodes 2 and 3. Further, node 1 is electrically connected to Q 125 output of D flip-flop 120. Node 2 is electrically connected which is the complementary output of Q 125. Capacitor C1 150 is connected between node 3 and ground 115. Node 3 is the output terminal of the network. Resistors R1 130 and R2 140, being electrically connected across the outputs Q 125 and Q 127, divide the output voltages.

Figure 2A:
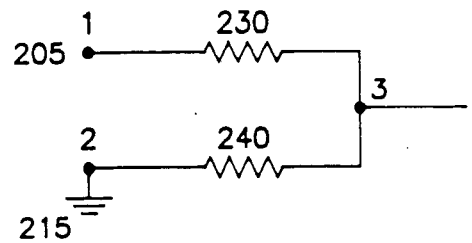
FIG. 2a and 2b are schematic diagrams utilized to illustrate the operation of the invention in FIG. 1.
Figure 2B:
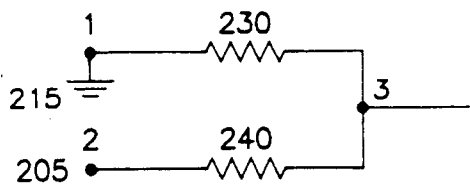

FIG. 2 is a simplified version of how the resistor network of FIG. 1 works. The resistor network of FIG. 2a and 2b has the same configuration as that of FIG. 1 but with resistors R1 230 and R2 240 in lieu of resistors R1 130 and R2 140, respectively. Therefore, in FIG. 2a, when the input voltage to node 1 is Vref 205 and the input to node 2 is ground 215 or zero volts, the voltage at node 3 is:

$$Vref(R2/(R1+R2))$$

In FIG. 2b, the input to node 2 is Vref 205 and the input to node 1 is ground 215. In this instance, the output of node 3 is:

$$Vref(R1/(R1+R2))$$

Since the terminals are constantly changing states between Vref 205 and ground 215, the output at node 3 becomes:

$$\tfrac{1}{2} Vref[(R/(R1/(R+R2))+(R2/(R1+R2))]$$

This simplifies to:

$$\tfrac{1}{2}(Vref)$$

As the inputs to R1 130 and R2 140 of FIG. 1 are constantly oscillating between Vref 105 and ground 115, and C1 150 filters any ripple voltage which is caused by the mismatch in R1 130 and R2 140; the accuracy of R1 130 and R2 140 is no longer a factor in the accuracy of the voltage divider. This allows one to use nonprecision resistors for resistors R1 130 and R2 140.

The output of the resistor network is at node 3. As the output of the resistor network is load sensitive, it is helpful to input the signal on node 3 into buffer amplifier 160. Buffer amplifier 160 in FIG. 1 is a simple voltage follower. By adding the buffer amplifier the circuit is no longer load sensitive and thus retains its accuracy.

Figure 3:
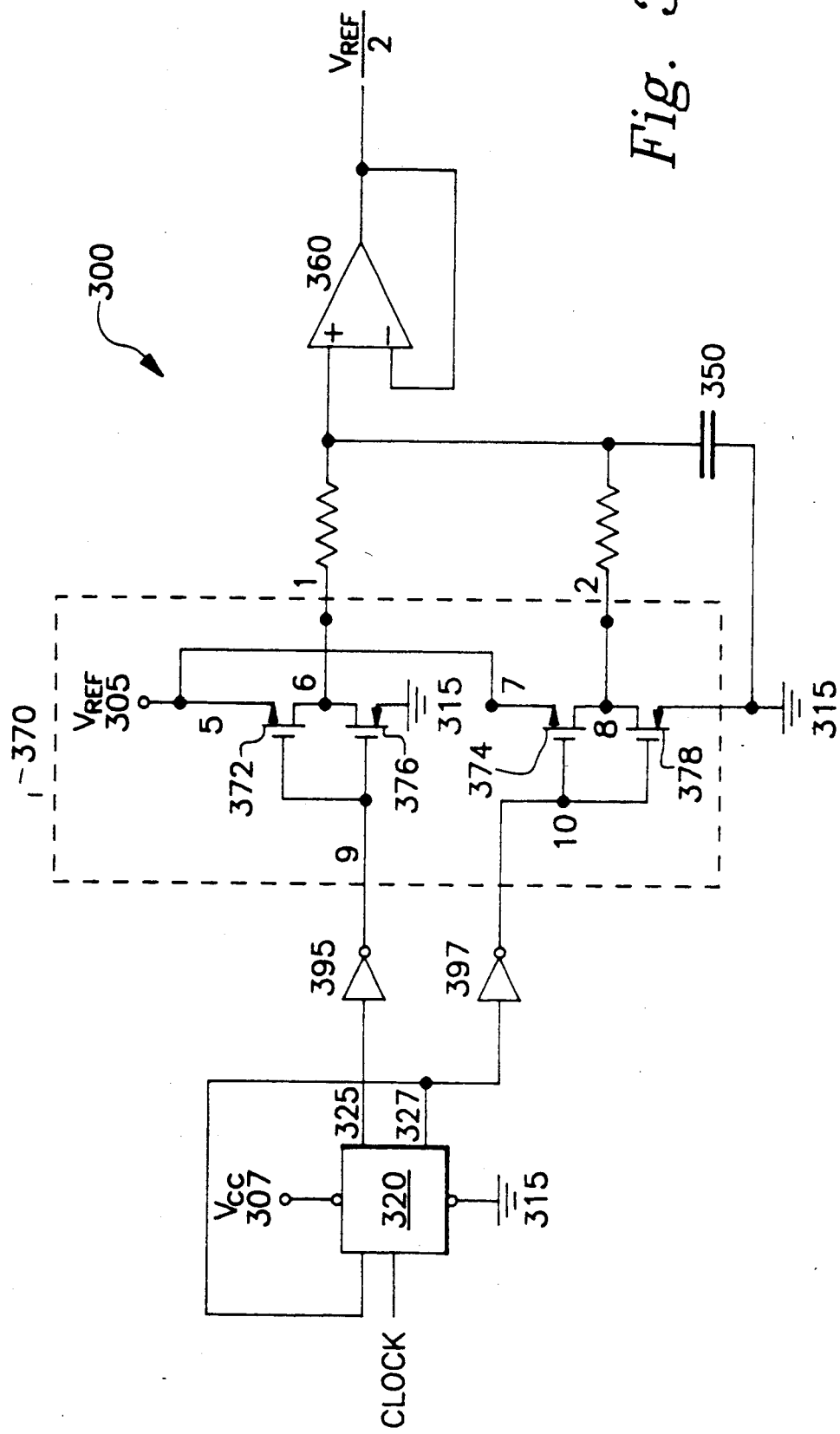
FIG. 3 is a more complex variation of the apparatus of FIG. 1 wherein the voltage reference need not be adapted to a CMOS voltage level.

Embodiment 300 of the invention is shown in FIG. 3. Embodiment 300 incorporates MOSFET transistor circuit 370 which enables device 300 to utilize a variety of reference voltages without having to specifically adapt a reference voltage for flip-flop 320. In embodiment 300, D flip-flop 320 is powered through a separate source Vcc 307 and the outputs of Q 325 and Q 327 are input into voltage drivers 395 and 397. The outputs of drivers 395 and 397 are input into two MOSFET networks. The two MOSFET networks are similar to each other, wherein Vref 305 is connected to nodes 5 and 7 of the circuit. The source of n channel MOSFET 372 is connected to node 5. The source of n channel MOSFET 374 is connected to node 7. The drain of each n channel MOSFET, 372 and 374, is electrically connected to a separate node that is, nodes 6 and 8, respectively. Node 6 is connected to the drain of p channel MOSFET 376. Node 8 is connected to the drain of p channel MOSFET 378. The sources of p channel MOSFETS 376 and 378 are connected to ground 315. Node 6 is connected to node 1, and node 8 is connected to node 2.

The oscillating signal from flip-flop 32 is provided to the gates of the transistors 372, 374, 376 and 378. The gate of n channel transistor 372 and the gate of the first p channel transistor 376 are connected at node 9. The gate of n channel transistor 374 and the gate of p channel transistor 378 are connected to node 10. Node 9 is then electrically connected to the output of driver 395. Similarly node 10 is connected to the output of driver 397. In this manner, outputs of the MOSFET network 370 are oscillated between Vref 305 and ground 315 like embodiment 10 in FIG. 1. The difference is that Vref 305 need not be the same voltage level as the voltage level of the power supply for D CMOS flip-flop 320.

The following is claimed:

1. A precision voltage divider comprising:
signal means for providing a first oscillating signal having a first peak voltage magnitude, and a second oscillating signal having the first peak voltage magnitude and being a complementary signal of the first oscillating signal;
first load means, connected to said signal means, for receiving the first signal;
second load means, connected to said signal means and to said first load means, for receiving the second signal, combining the first and second signals into a third signal; and
filter means, connected to said first and second load means, for filtering the third signal into a fourth signal wherein the fourth signal has a second voltage magnitude.

2. Apparatus of claim 1 wherein: the second voltage magnitude is equivalent to one-half of the first peak voltage magnitude.

3. Apparatus of claim 2 wherein:
said first load means is a resistor having a first value in ohms; and
said second load means is a resistor having a second value in ohms within fifty percent of the first value.

4. Apparatus of claim 3 wherein:
said first load means has an input connected to said signal means, and has an output;
said second load means has an input connected to said signal means and an output connected to the output of said first load means; and
said filter means is connected to the outputs of said first and second means.

5. Apparatus of claim 4 wherein:
said filter means is a capacitor;
said signal means is a flip-flop having a clock input, having a first output for providing the first oscillating signal and a second output for providing the second oscillating signal; and
said flip-flop has a power input for a voltage having the first voltage magnitude.

6. Apparatus of claim 5 further comprising a buffer amplifier connected to the output of the first and second load means.

7. Apparatus of claim 2 wherein: said first load means comprises:
a first transistor having a first terminal connected to said signal means, for receiving the first oscillating signal, and having second and third terminals; and
a second transistor having a first terminal connected to the first terminal of said first transistor, having a second terminal connected to the second terminal of said first transistor and having a third terminal connected to a point of common potential; and
said second load means comprises:
a third transistor having a first terminal connected to said signal means, for receiving the second oscillating signal, having a third terminal connected to the third terminal of said first transistor, and having a second terminal; and
a fourth transistor having a first terminal connected to the first terminal of said third transistor, having a second terminal connected to the second terminal of said third transistor, and having a third terminal connected to a point of common potential.

8. Apparatus of claim 7 further comprising:
a first resistor having a resistive ohm value, having a first terminal connected to the second terminal of said first transistor, and having a second terminal;
a second resistor having a resistive ohm value within fifty percent of the resistive ohm value of said first resistor, having a first terminal connected to the second terminal of said third transistor, and having a second terminal connected to the second terminal of said first resistor; and
filter means, having a first terminal connected to the second terminal of said second resistor, and having a second terminal connected to the third terminal of said fourth transistor, for filtering out undesirable signals present between the first and second terminals of said filter means and passing said fourth signal.

9. Apparatus of claim 8 wherein if a direct current having the first voltage magnitude is applied across the third terminal of said first transistor and the third terminal of said fourth transistor and the third terminal of said fourth transistor and said signal means provides the first and second signals, then an output having the second voltage magnitude will be present across the first and second terminals of said filter means.

10. Apparatus of claim 9 wherein:
said filter means is a capacitor; and
said signal means is a flip-flop having a clock input, having a first output for providing the first signal and a second output for providing the second signal.

11. Apparatus of claim 10 wherein:
said first, second, third and fourth transistors are field effect transistors; and
the first, second and third terminals of said first, second, third and fourth transistors, are a base terminal, a drain terminal and a source terminal, respectively.

12. Apparatus of claim 11 further comprising:
a first buffer connected between the first output of said flip-flop and the first terminal of said first transistor;
a second buffer connected between the second output of said flip-flop and the first terminal of said third transistor; and
a third buffer having an input connected to the second terminal of said first resistor, and having an output.

13. Apparatus of claim 12 wherein:
said first and third field effect transistors are n-channel transistors; and
said second and fourth field effect transistors are p-channel transistors.

14. A precision voltage divider to precisely divide a first d.c. voltage reference signal with respect to a second d.c. voltage reference signal, said precision voltage divider comprising:

first means for providing a first oscillating signal, said first oscillating signal having peak voltages being said first reference voltage signal and said second reference voltage signal;
second means for providing a second oscillating signal, said second oscillating signal being the complement of said first oscillating signal; and
a network comprising:
a first resistor, a second resistor, and a capacitor, said first resistor being connected to said second resistor, said capacitor being connected to said first and said second resistors, said first oscillating signal being provided to said first resistor, and said second oscillating signal being provided to said second resistor.

15. The apparatus of claim 14 wherein said first and second means for providing said first oscillating signal and said second oscillating signal are a flip-flop.

16. The apparatus of claim 14 further comprising a buffer amplifier connected to said capacitor.

17. The apparatus of claim 15 further comprising a buffer amplifier connected to said capacitor.

18. The apparatus of claim 14 wherein said second voltage reference signal is ground.

19. The apparatus of claim 17 wherein said second voltage reference signal is ground.

20. The apparatus of claim 14 wherein said first and second means for providing said first and said second oscillating signals comprise a transistor circuit means for receiving said first voltage reference signal and said second voltage reference signal.

21. The apparatus of claim 20 wherein said first and second means for providing said first and said second oscillating signals further comprise:
a first voltage driver;
a second voltage driver; and
a flip-flop.

22. The apparatus of claim 21 wherein said flip-flop is clocked by a clock, said flip-flop outputting a third and a fourth oscillating signal, said fourth oscillating signal being the complement of said third oscillating signal, said third oscillating signal being input into said first voltage driver, said fourth oscillating signal being input into said second voltage driver, said first voltage driver outputting the first oscillating signal, and said second voltage driver outputting the second oscillating signal.

* * * * *

UNITED STATES PATENT AND TRADEMARK OFFICE
CERTIFICATE OF CORRECTION

PATENT NO. : 5,030,848
DATED     : July 9, 1991
INVENTOR(S) : Michael A. Wyatt

It is certified that error appears in the above-identified patent and that said Letters Patent is hereby corrected as shown below:

Column 5, line 9, cancel "and the third terminal of"; and line 10, cancel "said fourth transistor".

Signed and Sealed this

Sixteenth Day of February, 1993

Attest:

STEPHEN G. KUNIN

Attesting Officer          Acting Commissioner of Patents and Trademarks